United States Patent
Limaye et al.

(10) Patent No.: US 8,941,236 B2
(45) Date of Patent: Jan. 27, 2015

(54) USING COLLAPSE LIMITER STRUCTURES BETWEEN ELEMENTS TO REDUCE SOLDER BUMP BRIDGING

(71) Applicants: Ameya Limaye, Chandler, AZ (US); Richard J. Harries, Chandler, AZ (US); Sandeep B. Sane, Chandler, AZ (US)

(72) Inventors: Ameya Limaye, Chandler, AZ (US); Richard J. Harries, Chandler, AZ (US); Sandeep B. Sane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/631,713

(22) Filed: Sep. 28, 2012

(65) Prior Publication Data

US 2014/0091456 A1    Apr. 3, 2014

(51) Int. Cl.
*H01L 23/48* (2006.01)

(52) U.S. Cl.
USPC ......................................................... 257/737

(58) Field of Classification Search
USPC ......................................................... 257/737
See application file for complete search history.

(56) References Cited

U.S. PATENT DOCUMENTS

| | | | |
|---|---|---|---|
| 3,871,015 A | 3/1975 | Lin et al. | |
| 4,545,610 A | 10/1985 | Lakritz et al. | |
| 5,598,036 A * | 1/1997 | Ho | 257/738 |
| 5,950,073 A | 9/1999 | Griffin, IV et al. | |
| 5,968,670 A | 10/1999 | Brofman et al. | |
| 6,506,681 B2 | 1/2003 | Grigg et al. | |
| 6,541,305 B2 * | 4/2003 | Farooq et al. | 438/108 |
| 6,552,425 B1 | 4/2003 | Yan et al. | |
| 6,559,527 B2 | 5/2003 | Brofman et al. | |
| 6,631,078 B2 * | 10/2003 | Alcoe et al. | 361/719 |
| 6,653,730 B2 | 11/2003 | Chrysler et al. | |
| 6,667,548 B2 | 12/2003 | O'Connor et al. | |
| 6,673,697 B2 | 1/2004 | Ma et al. | |
| 6,703,697 B2 | 3/2004 | Leahy et al. | |
| 6,753,613 B2 | 6/2004 | Levardo et al. | |
| 6,849,944 B2 * | 2/2005 | Murtuza et al. | 257/734 |
| 7,160,757 B2 | 1/2007 | Narkhede et al. | |
| 2004/0109283 A1 | 6/2004 | Emma et al. | |
| 2005/0051906 A1 | 3/2005 | He et al. | |
| 2005/0067685 A1 | 3/2005 | Patel | |
| 2011/0084375 A1 * | 4/2011 | Eu et al. | 257/690 |
| 2012/0020040 A1 * | 1/2012 | Lin et al. | 361/772 |

* cited by examiner

*Primary Examiner* — David Vu
*Assistant Examiner* — Brandon Fox
(74) *Attorney, Agent, or Firm* — Konrad Raynes Davda & Victor LLP; David W. Victor (57) ABSTRACT

Provided are an electronic assembly and method for forming the same, comprising a first element having a first surface and a second element having a second surface.

Electrical connections are provided between the first and the second elements formed by heating solder bumps. At least one collapse limiter structure is coupled to at least one of the first and the second surfaces, wherein the at least one collapse limiter structure is between at least two of the electrical connections.

16 Claims, 5 Drawing Sheets

USING COLLAPSE LIMITER STRUCTURES BETWEEN ELEMENTS TO REDUCE SOLDER BUMP BRIDGING

RELATED ART

Integrated circuits may be formed on semiconductor wafers made from materials such as silicon. The semiconductor wafers are processed to form various electronic devices. The wafers are diced into semiconductor chips (a chip is also known as a die), which may then be attached to a package substrate using a variety of known methods.

The package substrate may be mounted on a printed circuit board using surface mount technology (SMT). In one known method for mounting a package substrate to a printed circuit board, the package substrate may have solder bumps which are electrically coupled to a surface of the package substrate. The solder bump contacts extend onto solder paste printed on contact pads of the printed circuit board, and are typically attached in a thermal reflow process. Electronic signals may be provided through the solder bump contacts to and from the package substrate, including the integrated circuits, and the printed circuit board.

The material of the package substrate typically does not provide a match with the material of the integrated circuit die with respect to the coefficient of thermal expansion. Thermal expansion mismatch can lead to undesirable stresses developing in the electronic assembly during processing procedures, in particular, during heating and cooling operations. Such stresses may cause the package substrate to warp.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to electronic assemblies. Embodiments include both devices and methods for forming electronic assemblies.

Reference below will be made to the drawings wherein like structures may be provided with like reference designations. In order to show the structures of various embodiments most clearly, the drawings included herein include diagrammatic representations of electronic devices and other components. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Warpage of the package substrate SMT mounted on a printed circuit board using solder bumps may result in solder bump bridging. Solder bump bridging occurs when the second level interconnect (SLI) substrate package collapses toward the printed circuit board during mounting causing joints formed by solder bumps in the center of the package to become compressed and extrude to short out with neighboring joints. The amount of collapse is a function of package warpage, solder ball volume, paste and ball pattern design. Described embodiments provide collapse limiter structures that for a given package and board design, inhibit solder bump bridging.

Figure 1:
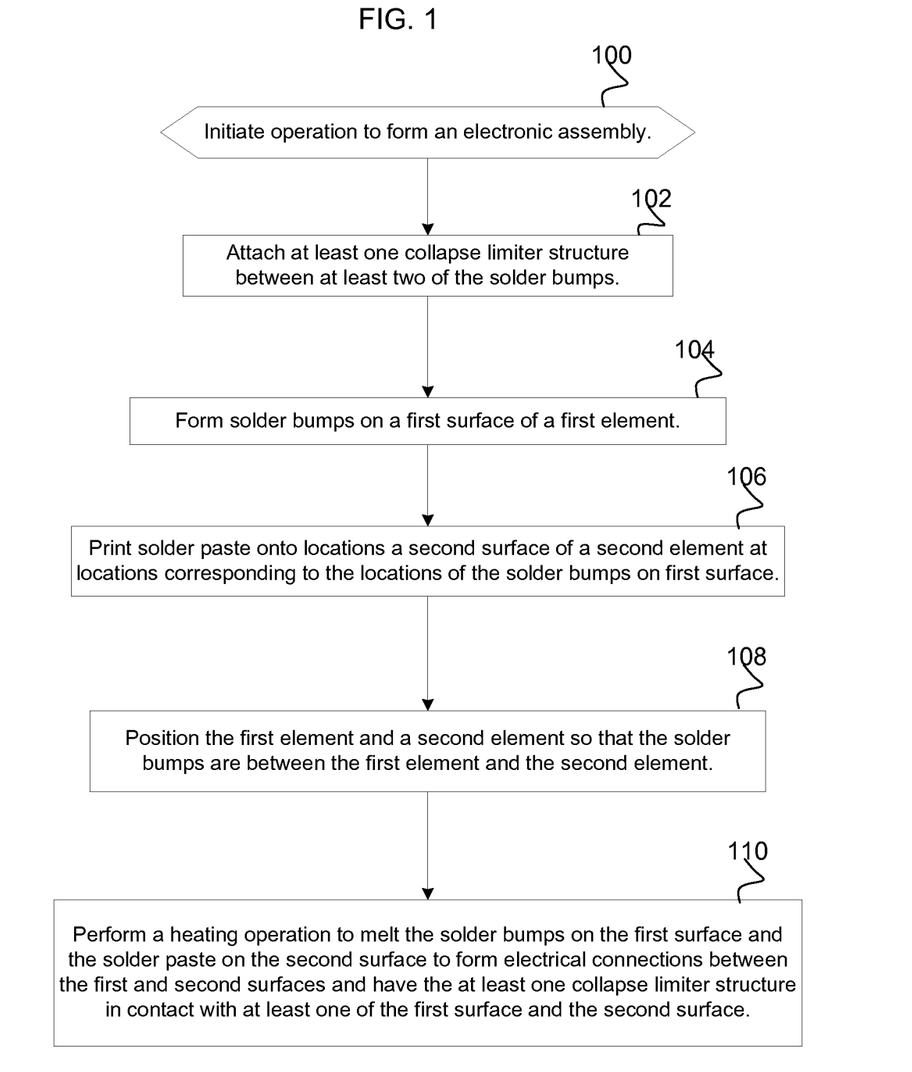
FIG. 1 illustrates an embodiment of operations to mount a first element to a second element.

FIG. 1 illustrates a flow of operations to surface mount a first element to a second element using solder bumps, where the first element may comprise a package substrate and the second element a printed circuit board. Alternatively, the first element may comprise an integrated circuit die and the second element may comprise a package substrate onto which the integrated circuit die is mounted.

The operations of FIG. 1 are described with respect to the semiconductor devices described with respect to the devices shown in FIGS. 2-9. The operations described herein may be performed using semiconductor fabrication systems and machines known in the art comprised of a plurality of stations to perform the processing of the semiconductor devices as described herein.

Figure 2:
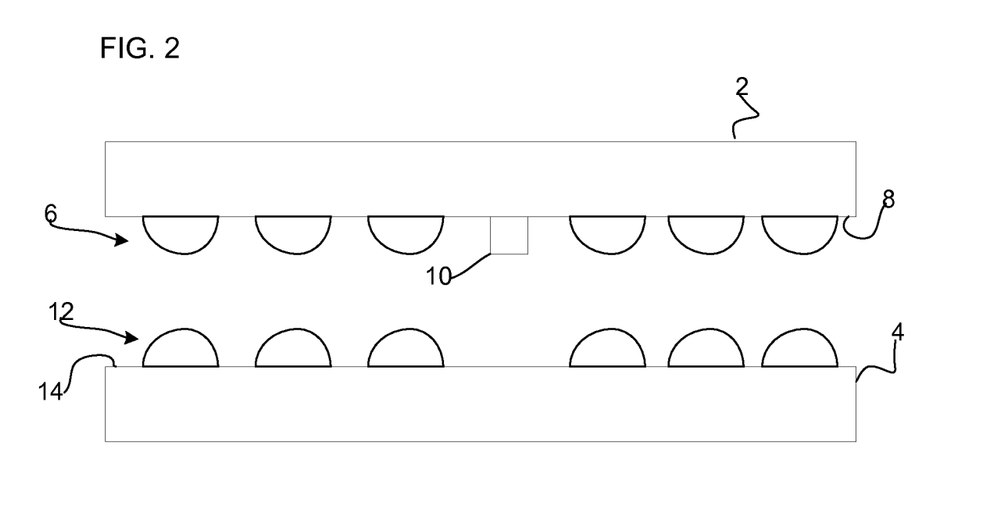
FIG. 2 illustrates an embodiment of first and second elements positioned for mounting.

With respect to FIGS. 1 and 2, at block 100 an operation is initiated to use surface mount technology (SMT) to mount a first element 2 onto a second element 4. With respect to FIG. 2, the first element 2 may comprise a package substrate on which semiconductor devices, such as integrated circuit dies, are mounted, and the second element 4 may comprise a printed circuit board on which the package substrate 2 is mounted.

At block 102, at least one collapse limiter structure 10 (FIG. 2) is attached to the first surface 8 at a location that will be between locations at which least two of the solder bumps will later be positioned. In further embodiments, the collapse limiter structure 10 may be positioned in other locations on the first surface 8, such as, but not limited to, edges or corners on the first surface 8.

In one embodiment, the collapse limiter structure 10 comprises a post that may comprise a variety of shapes, including, but not limited to, a substantially cylindrical shape, rectangular shape, a u-shape, and a spring shape. The collapse limiter structure 10 may be located at substantially the center of the first surface 8 of the substrate package. In alternative embodiments, the collapse limiter structure 10 may be located and dispersed among an array of solder bumps 6 attached to the first surface 8. In an alternative embodiment, the collapse limiter structure 10 may be attached to the second surface 14. The collapse limiter structure 10 may be formed of ceramic, polymer or other suitable support structure materials that do not melt during the reflow heating operation.

At block 104, solder bumps 6 are formed on a first surface 8 of the first element 2 through a heating process that melts, or reflows, the solder bumps onto pads (not shown) on the first surface 8. In embodiments where the first element 2 is a package substrate, integrated circuit dies may be mounted on the package substrate surface opposite the first surface on which the solder bumps are attached. The solder bumps 6, such as solder balls or similar suitable material for forming an electrical contact between the first 2 and second elements 4, may be positioned on the pads (not shown) on the first surface 8.

Figure 3:
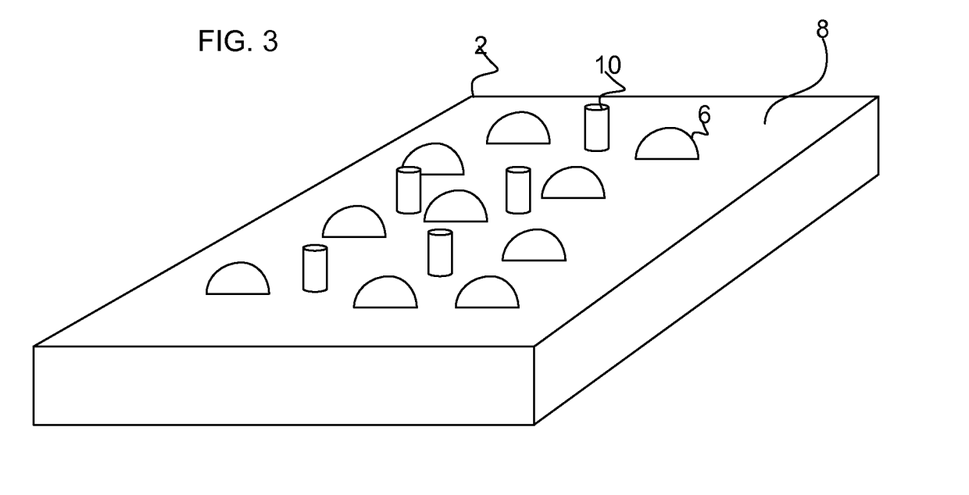
FIG. 3 illustrates an embodiment of a design of a layout of solder bumps and collapse limiter structures on a surface of a package substrate.

FIG. 3 illustrates an embodiment showing a pattern of how the collapse limiter structure 10, shown as the posts in FIG. 3, may be dispersed among an array of solder bumps 6, shown as the semi-circular shaped elements.

With respect to FIGS. 1 and 2, at block 106, solder paste, shown as bumps 12, is printed to locations or pads (not shown) on a second surface 14 of the second element 4 at locations that will contact the solder bumps 6 when mounted. The printing of the solder paste on the second surface 14 may be performed independently of the attachment of the solder bumps 6 and collapse limiter structure 10 to the first surface 8. The solder paste 12, also referred to as solder flux, may comprise powdered metal solder suspended in a thick medium or flux.

In certain embodiments, the length of the collapse limiter 10 may be less than the length of the solder bumps 6 on the first surface 8. For example, the collapse limiter structure 10 may be 100 microns wide and a height of 100-150 microns in the vertical direction, and the vertical length of the solder bumps 6 before melting may be 200-400 microns in vertical length. Other dimensions of the collapse limiter structure 10 and solder bumps 6 may also be used. The collapse limiter structure 10 is intended to limit the collapse of the first surface 8 toward the second surface 14 so that the solder bumps 2 are not compressed to a level that results in solder bump bridging. The maximum height collapse of any package 2 is limited by the height of the collapse limiter structure 10.

When the first element 2 is mounted on the second element 4, the end of the collapse limiter structure 10 opposite the end attached to the first 8 or second surface 14 may or may not come into contact with the surface opposite the attachment surface. The extent of the collapse of the solder connection determines whether the collapse limiter structure 10 will move into contact with the second surface 14 or whether a gap will remain between the second surface and the collapse limiter structure 10.

At block 108, first element 2 and the second element 4 are positioned so that the solder bumps 6 are between the first element 2 and the second element 2, as shown in FIG. 2.

At block 110, a heating operation is performed, such as by sending the first element 2 and second element 4, positioned as shown in FIG. 2, through a reflow oven to reflow the solder bumps 6 and the solder paste 12 to form a solder connection between the first surface 8 and the second surface 14. When the electrical connections are formed, the collapse limiter structure 10 may or may not be in contact with the second surface 14, depending on whether a substantial amount of collapse has occurred.

Figure 4:
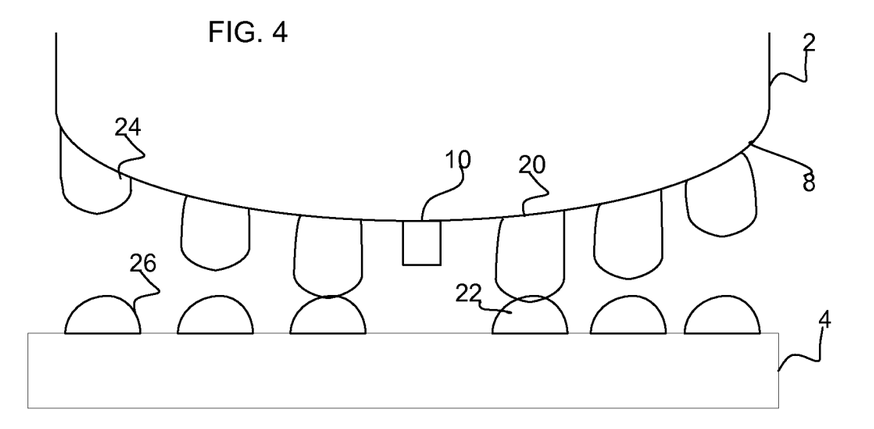
FIG. 4 illustrates an embodiment of a state of the first and second elements during heating.

FIG. 4 shows a state of the first element 2 and second element 4 during a heating process, where the first element 2 warps, as shown by the curved first surface 8. The warpage causes the inner solder balls 20 to move closer into the inner paste 22 formations, whereas outer solder balls 24 remain further separated from the outer paste 26 formations.

FIG. 4 shows the first element 2 having warpage. In certain embodiments, the first element 2, e.g., package substrate, may experience warping as a result of a heating operation independent of the mounting of the first element 2 onto the second element 4, e.g., when the die is mounted on the package substrate. The first element 2 may experience further warping when heated according to the heating operation at block 110 in FIG. 1. In an alternative embodiment, the first element 2 may not be warped when introduced to the mounting procedure of FIG. 1 and may experience warping during the heating operation at block 110 in FIG. 1.

Figure 5:
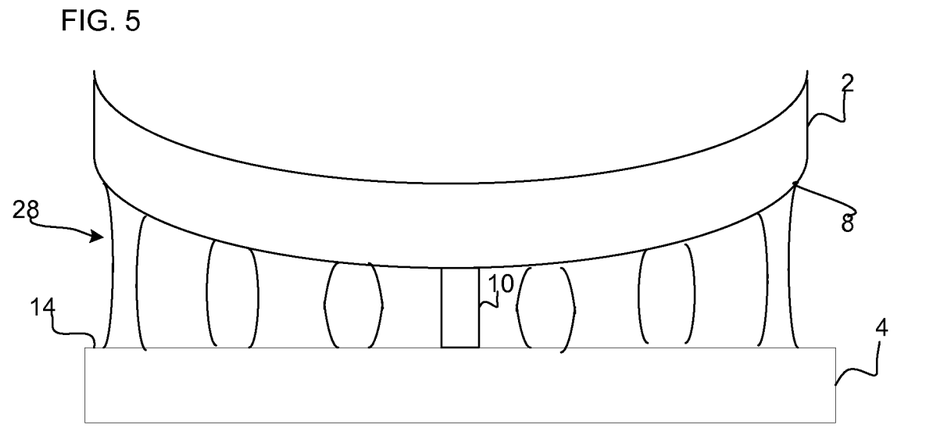
FIGS. 5, 6, and 7 illustrate embodiments of the result of the heating process on the first and second elements when different shaped collapse limiter structures are used.

FIG. 5 shows a state of the first element 2 and the second element 4 when the solder balls 6 and solder paste have melted to form connections 28, e.g., joints, electrical connections, from the first surface 8 to the second surface 14. Further, the first element 2, e.g., package substrate, has warped so that the collapse limiter structure 10 contacts the second surface 14.

Figure 6:
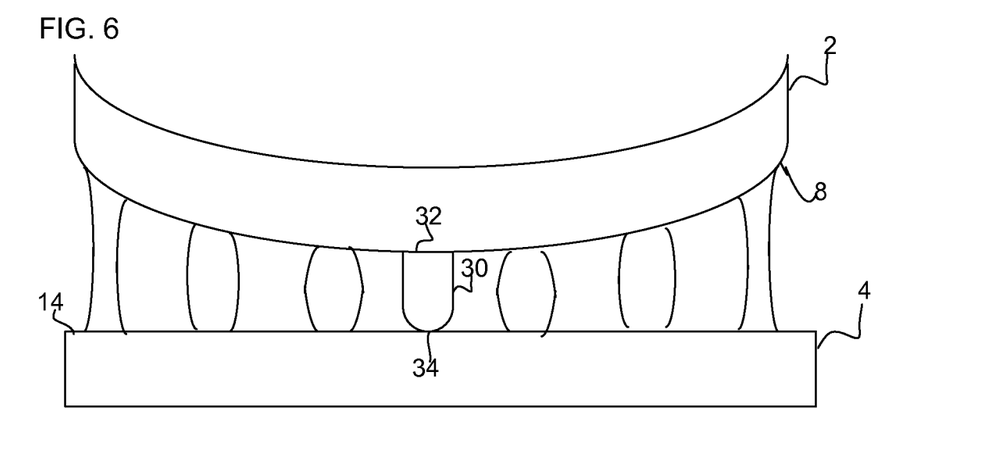
Figure 7:
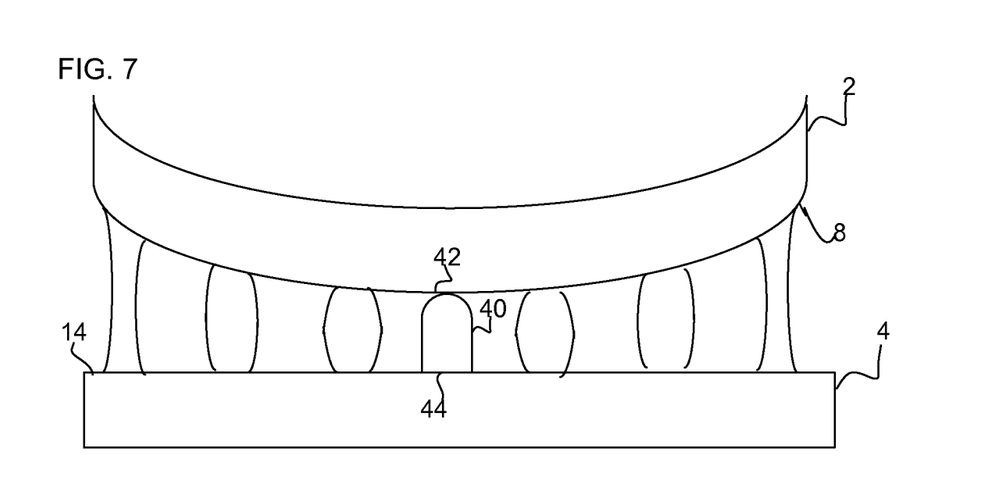

FIGS. 6 and 7 show further embodiments of the first element 2 mounted to the second element 4 as a result of the heating process when different shaped collapse limiter structures are used. In FIGS. 6 and 7 collapse limiter structures 30 and 40 have one end curved so as to flex as the first surface 8 of the package collapses at the point of the collapse limiter structure 30, 40 toward the second surface 14.

In FIG. 6, a flat end 32 of the collapse limiter structure 30 is connected to the first surface 8 of the first element 2, and the curved surface 34 contacts the second surface 14. As the solder collapses and the first surface 8 moves toward the second element 4, the curved surface 34 may flex inward to allow for a flexible contact with the second surface 14 at different collapse levels for the first surface 8.

In FIG. 7, a flat end 42 of the collapse limiter structure 40 is connected to the first surface 8 of the first element 2, and the curved surface 44 contacts the second surface 14. As the first surface 8 warps, the curved surface 44 may flex inward to allow for a flexible contact with the second surface 14 at different collapse levels for the first surface 8.

Figure 8:
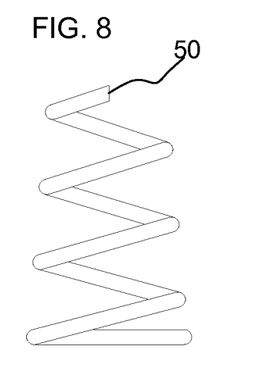
FIGS. 8 and 9 illustrate embodiments of a collapse limiter structure.

FIG. 8 shows an embodiment of a collapse limiter structure 50 having a spring shape, where one end of the spring 50 is attached to the first 8 or second 14 surface and the other end may come into contact with the other surface during mounting depending on the amount of solder collapse that occurs.

Figure 9:
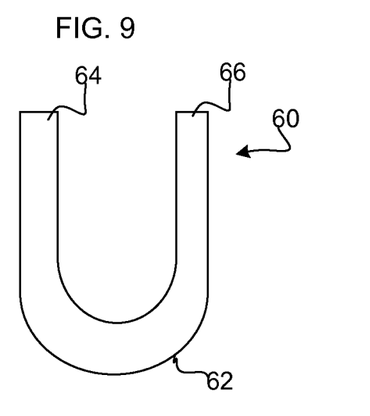

FIG. 9 shows an embodiment of a u-shaped collapse limiter structure 60 having a curved end 62 and two opposite ends 64 and 66. The ends 64 and 66 may attach to one surface 8 or 14 and the curved end 62 may come into contact with the other surface if collapse is sufficient to result in contact. The curved surface 62 may flex inward to allow for a flexible contact with the second surface 14 at different collapse levels for the first element 2.

As shown in FIGS. 5-9, the collapse limiter structures 10, 30, 40, 50, and 60 have lengths to limit the collapse of the first surface 8 of the package substrate toward the second surface 14 during the heating. In this way, the length of the collapse limiter structures 10, 30, 40, 50, and 60 limits the extent of the collapse of the first surface 8 of the package substrate due to warping that occurs during reflow.

In an alternative embodiment, the first element 2 may comprise an integrated circuit die, or wafer, and the second element may comprise the package substrate on which the semiconductor die is mounted. In such an embodiment, the collapse limiter structures may be formed between solder bumps attached to the surface of the semiconductor die, so that the collapse limiter structures limit the collapse of the lower surface of the die toward the package substrate.

The collapse limiter structures allow highly warped packages to be successfully mounted. Further, heavy packages which would otherwise cause the solder bumps to compress and bridge may be supported by the collapse limiter structures. The collapse limiter structures support the weight of heavy packages, e.g., 150 grams, so as to prevent the package from compressing the solder bumps and causing bridging and electrical shorting between adjacent pads. Yet further, by limiting and controlling the collapse of the substrate package, the collapse limiter structures provide for a more uniform height or collapse between packages.

Collapse limiter structures are particularly useful for packages with multiple cavities in their solder bump pattern. Multiple cavities provide greater opportunities for the solder bumps to bridge. Fabricating collapse limiter structure between these solder bumps inhibits the risk of bridging. Further, certain packages require components such as surface mount device (SMD) pads, which may induce solder bump bridging. Introducing collapse limiter structures allows the use of such pads while mitigating solder bump bridging that would otherwise be introduced by the use of these pads if there were no collapse limiter structures.

Figure 10:
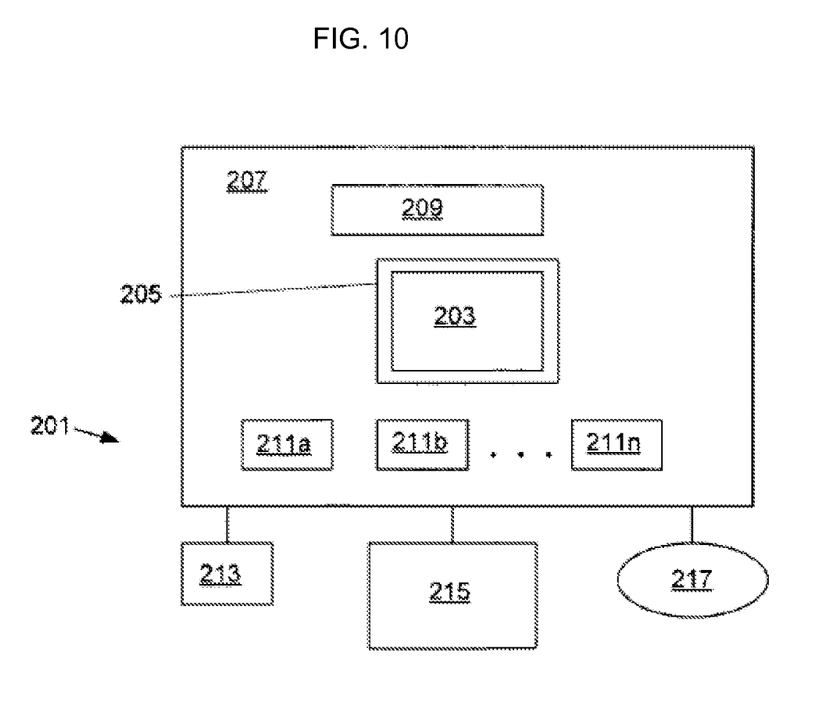
FIG. 10 illustrates an embodiment of a computing environment in which aspects of the description provided herein are embodied.

FIG. 10 schematically illustrates one example of an electronic system environment in which aspects of described embodiments may be embodied. Other embodiments need not include all of the features specified in FIG. 10, and may include alternative features not specified in FIG. 10.

The system 201 of FIG. 10 may include at least one central processing unit (CPU) 203. The CPU 203, also referred to as a microprocessor, may be a chip which is attached to an integrated circuit package substrate 205, which is then coupled to a printed circuit board 207, which in this embodiment, may be a motherboard. The package substrate 205 coupled to the printed circuit board 207 is an example of an electronic device assembly that may have the collapse limiter structures in accordance with embodiments such as described above. In further embodiments, the collapse limiter structures may be positioned between the package substrate 205 and the CPU 203. A variety of other system body portions, including, but not limited to memory and other body portions discussed below, may also include chip and substrate structured formed in accordance with the embodiments described above.

The system 201 further may further include memory 209 and one or more controllers 211a, 211b . . . 211n, which are also disposed on the motherboard 207. The motherboard 207 may be a single layer or multi-layered board which has a plurality of conductive lines that provide communication between the circuits in the package 205 and other body portions mounted to the board 207. Alternatively, one or more of the CPU 203, memory 209 and controllers 211a, 211b . . . 211n may be disposed on other cards such as daughter cards or expansion cards. The CPU 203, memory 209 and controllers 211a, 211b . . . 211n may each be seated in individual sockets or may be connected directly to a printed circuit board. A display 215 may also be included.

Any suitable operating system and various applications execute on the CPU 203 and reside in the memory 209. The content residing in memory 209 may be cached in accordance with known caching techniques. Programs and data in memory 209 may be swapped into storage 213 as part of memory management operations. The system 201 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant) telephony device (wireless or wired), network appliance, virtualization device, storage controller, network controller, router, etc.

The controllers 211a, 211b . . . 211n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 213 in accordance with a storage protocol layer. The storage protocol of the layer may be any of a number of known storage protocols. Data being written to or read from the storage 213 may be cached in accordance with known caching techniques. A network controller can include one or more protocol layers to send and receive network packets to and from remote devices over a network 217. The network 217 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

The illustrated operations of the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

Terms such as "first", "second", and the like, may be used herein and do not necessarily denote any particular order, quantity, or importance, but are used to distinguish one element from another. Embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. An electronic assembly, comprising:
a first element having a first surface;
a second element having a second surface;
electrical connections between the first and the second elements formed by heating solder bumps; and
a plurality of collapse limiter structures coupled to at least one of the first and the second surfaces, wherein the plurality of collapse limiter structures are dispersed in an array of the electrical connections, wherein the array includes at least three electrical connections in a first direction and at least four electrical connections in a second direction, and wherein in the array, a plurality of the collapse limiter structures are positioned between different pairs of electrical connections in the first direction and the second direction wherein a length of the collapse limiter structures dispersed in the array between different pairs of electrical connections is less than a height of the electrical connections attached to the first surface before the heating operation.

2. The electronic assembly of claim 1, wherein at least one of the collapse limiter structures comprises:
   a first end of the collapse limiter structure connected to the first surface; and
   a second flexible end of the collapse limiter structure that is substantially curved such that when the curved second flexible end contacts the second surface the collapse limiter structure flexes.

3. The electronic assembly of claim 2, wherein the first end comprises two ends separated by a space to form a u-shaped collapse limiter structure.

4. The electronic assembly of claim 1, wherein at least one of the collapse limiter structures comprises a spring shape.

5. The electronic assembly of claim 1, wherein the first element comprises a package substrate in which an integrated circuit die is mounted, and wherein the second element comprises a printed circuit board on which the package substrate is mounted.

6. The of claim 1, wherein the first element comprises an integrated circuit die and wherein the second element comprises a package substrate on which the integrated circuit die is mounted.

7. An electronic assembly, comprising:
   a package substrate having a first surface and having a semiconductor die mounted on a second surface;
   a printed circuit board having a third surface;
   electrical connections between the first surface and the third surface formed by heating solder bumps; and
   a plurality of collapse limiter structures coupled to at least one of the first and the third surfaces, wherein the collapse limiter structures are dispersed in an array of the electrical connections, wherein the array includes at least three electrical connections in a first direction and at least four electrical connections in a second direction, wherein at least one of the collapse limiter structures has a first end connected to the first surface and a second flexible end such that when the second flexible end contacts the second surface the collapse limiter structure flexes to allow for a flexible contact with the second surface at different collapse levels for the first surface, and wherein in the array, a plurality of the collapse limiter structures are positioned between different pairs of electrical connections in the first direction and the second direction wherein a length of the collapse limiter structures dispersed in the array between different pairs of electrical connections is less than a height of the electrical connections attached to the first surface before the heating operation.

8. The electronic assembly of claim 7, wherein the collapse limiter structure has a shape selected from the group consisting of: a spring shape, a cylindrical shape, and a u-shape.

9. A method for forming an electronic assembly, comprising:
   forming solder bumps on a first surface of a first element;
   positioning a plurality of collapse limiter structures to be dispersed in an array of the solder bumps, wherein the array includes at least three electrical connections in a first direction and at least four electrical connections in a second direction, wherein in the array, the collapse limiter structures are positioned between different pairs of the solder bumps in the first direction and the second direction wherein a length of the collapse limiter structures dispersed in the array between different pairs of electrical connections is less than a height of the electrical connections attached to the first surface before the heating operation;
   positioning the first element and a second element so that the solder bumps are between the first element and the second element;
   performing a heating operation to connect the solder bumps to a second surface of the second element to form electrical connections between the first and second surfaces, wherein the at the plurality of collapse limiter structures are coupled to at least one of the first surface and the second surface after the heating operation.

10. The method of claim 9, further comprising:
    forming solder paste on the second surface opposite the solder bumps on the first surface, wherein the heating causes the solder bumps and the solder paste to melt to form the electrical connections.

11. The method of claim 9, wherein at least one of the collapse limiter structures comprises a first end connected to the first surface and a second flexible end that is substantially curved such that when the curved second flexible end contacts the second surface the collapse limiter structure flexes.

12. The method of claim 11, wherein the first end comprises two ends separated by a space to form a u-shaped collapse limiter structure.

13. The method of claim 9, wherein at least one of the collapse limiter structures comprises a spring shape.

14. The method of claim 9, wherein the first element comprises a package substrate in which an integrated circuit die is mounted, and wherein the second element comprises a printed circuit board on which the package substrate is mounted.

15. The of method claim 9, wherein the first element comprises an integrated circuit die and wherein the second element comprises a package substrate on which the integrated circuit die is mounted.

16. A method for forming an electronic assembly, comprising:
   forming solder bumps on a first surface of a package substrate including a semiconductor die at which at least two solder bumps will be located;
   positioning a plurality of collapse limiter structures on the first surface, wherein the plurality of collapse limiter structures are dispersed among an array of the solder bumps wherein the array includes at least three solder bumps in a first direction and at least four solder bumps in a second direction, and wherein in the array, a plurality of the collapse limiter structures are positioned between different pairs of the solder bumps in the first direction and the second direction wherein a length of the collapse limiter structures dispersed in the array between different pairs of electrical connections is less than a height of the electrical connections attached to the first surface before the heating operation;
   forming solder paste on a second surface of a printed circuit board;
   positioning the package substrate and a printed circuit board so that the solder bumps are between the package substrate and the printed circuit board and at locations corresponding to locations of the solder past;
   performing a heating operation to have the solder bumps connect to the second surface of the printed circuit board to form electronic connections therebetween, wherein at least one of the collapse limiter structures has a first end connected to the first surface and a second flexible end such that when the second flexible end contacts the second surface during the heating the collapse limiter structure flexes to allow for a flexible contact with the second surface at different collapse levels for the first surface, and wherein the at least one collapse limiter structure is coupled to at least one of the first surface and the second surface after the heating operation.

* * * * *